United States Patent
Fujiyoshi et al.

(10) Patent No.: US 10,152,186 B2
(45) Date of Patent: Dec. 11, 2018

(54) INPUT DEVICE FOR DETECTING AN ELECTROSTATIC CAPACITANCE OF AN OBJECT

(71) Applicant: Alps Electric Co., Ltd., Ota-ku, Tokyo (JP)

(72) Inventors: Tatsumi Fujiyoshi, Miyagi-ken (JP); Yasuhiko Hiratate, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 7 days.

(21) Appl. No.: 15/468,616

(22) Filed: Mar. 24, 2017

(65) Prior Publication Data

US 2017/0199598 A1    Jul. 13, 2017

Related U.S. Application Data

(63) Continuation of application No. PCT/JP2015/077490, filed on Sep. 29, 2015.

(30) Foreign Application Priority Data

Oct. 15, 2014  (JP) ................................. 2014-210465

(51) Int. Cl.
*G06F 3/044* (2006.01)
*H03K 17/955* (2006.01)
(Continued)

(52) U.S. Cl.
CPC ............ *G06F 3/044* (2013.01); *G06F 3/0416* (2013.01); *H03K 17/955* (2013.01);
(Continued)

(58) Field of Classification Search
CPC ...................................................... G06F 3/044
(Continued)

(56) References Cited

U.S. PATENT DOCUMENTS

2009/0153152 A1* 6/2009 Maharyta ................ G06F 3/044
                                                                    324/684
2010/0110040 A1* 5/2010 Kim ...................... G06F 3/0412
                                                                    345/174
(Continued)

FOREIGN PATENT DOCUMENTS

| JP | 60-65620 | 4/1985 |
|----|----------|--------|
| JP | 2013-156812 | 8/2013 |
| WO | 2014/057569 | 4/2014 |

OTHER PUBLICATIONS

International Search Report from International Application No. PCT/JP2015/077490 dated Dec. 15, 2015.

*Primary Examiner* — Long D Pham
(74) *Attorney, Agent, or Firm* — Beyer Law Group LLP

(57) ABSTRACT

In a case where the amplitude of a detection voltage is increased, the amplitude of a drive current flowing in a detection-target capacitor also increases, and thus, the amplitude of a detection current also increases. In this case, the increase in amplitude of the detection current is not directly restricted by the condition of a power supply voltage range enabling a circuit to operate. For this reason, a current conversion ratio of a current output circuit or a capacitance value of a capacitor of a current-voltage conversion circuit is set to an appropriate value so as not to cause a voltage to exceed the power supply voltage range, thereby preventing the amplitude of the detection current from being restricted by the condition of the power supply voltage range. Therefore, it is possible to increase the amplitude of the detection voltage to a maximum within the power supply voltage range.

9 Claims, 12 Drawing Sheets

(51) Int. Cl.
*G06F 3/041* (2006.01)
*H03K 17/945* (2006.01)

(52) U.S. Cl.
CPC .............. *G06F 2203/04101* (2013.01); *G06F 2203/04107* (2013.01); *H03K 2017/9455* (2013.01); *H03K 2217/960705* (2013.01)

(58) Field of Classification Search
USPC ........................................................ 345/173
See application file for complete search history.

(56) References Cited

U.S. PATENT DOCUMENTS

2012/0001647 A1    1/2012  Ivanov
2013/0257786 A1*  10/2013  Brown .................... G06F 3/044
      345/174
2014/0035601 A1*  2/2014  Fujiyoshi; Tatsunni ....................
      G01R 35/00
      324/684

* cited by examiner

INPUT DEVICE FOR DETECTING AN ELECTROSTATIC CAPACITANCE OF AN OBJECT

CLAIM OF PRIORITY

This application is a Continuation of International Application No. PCT/JP2015/077490 filed on Sep. 29, 2015, which claims benefit of Japanese Patent Application No. 2014-210465 filed on Oct. 15, 2014. The entire contents of each application noted above are hereby incorporated by reference.

BACKGROUND OF THE INVENTION

1. Field of the Invention

The present invention relates to an input device which inputs information according to proximity of an object, and for example, to an input device, such as a touch pad or a touch sensor, including detection electrodes whose electrostatic capacitance changes according to proximity of an object.

2. Description of the Related Art

As a user interface device of an information apparatus, such as a smartphone, devices, such as a touch pad and a touch panel, including a sensor configured to detect a touch position of a finger or a pen become widespread. While there are various types, such as a resistive film type and an optical type, for a sensor configured to detect a touch position of an object, in recent years, an electrostatic capacitance type sensor is mounted in many mobile apparatuses since a configuration is simple and reduction in size is achieved.

The electrostatic capacitance type sensor primarily includes a mutual capacitance type sensor which detects change in electrostatic capacitance between a drive electrode and a detection electrode, and a self-capacitance type sensor which detects change in electrostatic capacitance of a detection electrode with respect to the ground. The mutual capacitance type sensor is capable of detecting change in electrostatic capacitance at a plurality of positions on the detection electrode and is thus suitable for multi-point detection compared to the self-capacitance type sensor. The self-capacitance type sensor directly detects change in electrostatic capacitance between a proximate object and the detection electrode, and thus, there is an advantage in that detection sensitivity is high compared to the mutual capacitance type sensor. For this reason, in a case of implementing a hovering function of detecting an operation of a finger at a position separated from an operation surface, or the like, the self-capacitance type sensor having high sensitivity is advantageous.

FIGS. 14A and 14B are diagrams showing the configuration of a general self-capacitance type sensor. FIG. 14A shows the configuration of a circuit, and FIG. 14B shows the waveforms of an AC voltage Vs and an output voltage Vout. If an object (finger or the like) regarded as a ground potential or a fixed potential is proximate to a detection electrode 81, a capacitor Cs is formed between the detection electrode 81 and the ground. The capacitor Cs changes according to the distance between the object and the detection electrode 81. For this reason, the capacitance value of the capacitor Cs is measured, thereby obtaining information relating to the proximity state of the object.

Since an output terminal of an operational amplifier 84 is connected to an inverting input terminal through a capacitor Cf, the voltage of the inverting input terminal substantially becomes equal to that of a non-inverting input terminal according to a negative feedback operation of the operational amplifier 84. That is, the voltage of the detection electrode 81 connected to the inverting input terminal of the operational amplifier 84 substantially becomes equal to the AC voltage Vs applied to the non-inverting input terminal. With this, a voltage which is substantially becomes to the AC voltage Vs is generated in the capacitor Cs, and an AC current according to the AC voltage flows in the capacitor Cs. An AC current which is substantially equal to that of the capacitor Cs flows in the capacitor Cf. Accordingly, the amplitude of the AC voltage generated in the capacitor Cf is proportional to the capacitance value of the capacitor Cs. The output voltage Vout becomes a voltage obtained by adding the voltage generated in the capacitor Cf and the AC voltage Vs. As shown in FIG. 14B, the output voltage Vout has amplitude greater than the AC voltage Vs.

Even in the self-capacitance type sensor having comparatively high sensitivity, since change in electrostatic capacitance due to the proximity of the finger is extremely minute, it is desirable to increase sensitivity as much as possible in preventing the influence of noise. In order to increase sensitivity in the circuit shown in FIG. 14A, the current flowing in the capacitor Cs has to be increased by increasing the amplitude of the AC voltage Vs. However, as shown in FIG. 14B, since the output voltage Vout has amplitude larger than the AC voltage Vs, if the amplitude of the output voltage Vout increases significantly, the output voltage Vout exceeds the power supply voltage range (VDD to GND). Actually, as shown in FIG. 14B, since the output voltage Vout does not exceed the power supply voltage range (VDD to GND), the output voltage Vout is restricted within the power supply voltage range and has a distorted waveform. The same problem occurs even if the AC voltage Vs is a sine wave or has other waveforms (square wave or the like), and remains unsettled even if the capacitor Cf is replaced with a resistive element. Accordingly, in the circuit shown in FIG. 14A, it is not possible to significantly increase the amplitude of the AC voltage Vs for driving the detection electrode 81, and there is a problem in that it is difficult to increase sensitivity.

In the detection electrode 81, in addition to the capacitor Cf, there is a parasitic capacitor having no relation with the proximate object. As a method of reducing a parasitic capacitor between the detection electrode 81 and a surrounding conductive substance, for example, a method which shields the detection electrode 81 with an electrode pattern having the same potential as the AC voltage Vs is considered. However, as shown in FIG. 15, there is a parasitic capacitor Cp in the input terminal of an operational amplifier 84. The parasitic capacitor Cp is caused by an element structure of a transistor 85, and cannot be removed with a shield or the like. If there is such a parasitic capacitor, apparently, the capacitance value of the capacitor Cs increases, and the AC voltage of the capacitor Cf increases. For this reason, the amplitude of the AC voltage Vs should further decrease, and there is a problem in that sensitivity decreases. Usually, while an error component of the parasitic capacitor is subtracted from the detection result of electrostatic capacitance using an analog or digital method, such processing in the post stage has no effect of decreasing the output voltage Vout of the initial stage circuit shown in FIG. 14A. For this reason, the decrease in sensitivity described above occurs inevitably.

Recently, when there is a demand for low power consumption for various purposes, high sensitivity is required.

However, in the technique of the related art, it is difficult to achieve high sensitivity while suppressing a power supply voltage to a low level.

SUMMARY OF THE INVENTION

The invention provides an input device capable of detecting minute electrostatic capacitance changing according to proximity of an object with high sensitivity.

An input device according to the invention is an input device which inputs information according to proximity of an object. The input device includes a detection electrode which is configured such that an electrostatic capacitance value of a detection-target capacitor formed between the detection electrode and the object changes according to the proximity of the object, and a current output circuit which outputs a drive current to the detection electrode such that a predetermined detection voltage having periodically changing level is generated in the detection electrode and outputs a detection current proportional to the drive current.

According to the above-described configuration, the drive current flows from the current output circuit to the detection electrode such that the detection voltage having the periodically changing level is generated in the detection electrode. Since the drive current flows in the detection-target capacitor, the drive current has a value according to the electrostatic capacitance value of the detection-target capacitor. Since the detection current output from the current output circuit is proportional to the drive current, the detection current has a value according to the electrostatic capacitance value of the detection-target capacitor. Therefore, the detection current has a value changing according to the proximity of the object and indicates information according to the proximity of the object.

In a case where the amplitude of the detection voltage is increased, the amplitude of the drive current flowing in the detection-target capacitor also increases, and thus, the amplitude of the detection current also increases. In this case, the increase in amplitude of the detection current is not directly restricted by the condition of a power supply voltage range that enables a circuit to operate. For this reason, for example, a circuit constant or the like is appropriately set, whereby it is possible to prevent the amplitude of the detection current from being restricted by the condition of the power supply voltage range. Therefore, since it is possible to increase the amplitude of the detection voltage to a maximum, it is possible to achieve improvement of sensitivity.

Preferably, the current output circuit may include an amplification circuit which amplifies the difference between the input detection voltage and a voltage generated in the detection electrode and outputs the drive current according to the amplification result to the detection electrode, and a current mirror circuit which outputs the detection current proportional to the drive current.

Alternatively, the current output circuit may include a first amplification circuit which amplifies the difference between the input detection voltage and a voltage of the detection electrode and outputs the drive current according to the amplification result to the detection electrode, and a second amplification circuit which amplifies the difference between the input detection voltage and the voltage of the detection electrode and outputs the detection current according to the amplification result.

Preferably, the input device may further include a current-voltage conversion circuit which outputs a voltage according to the detection current.

For example, the current-voltage conversion circuit may include a capacitor in which the detection current is input to one terminal thereof, and a third amplification circuit which amplifies the difference between a voltage of the one terminal of the capacitor and a reference voltage and outputs a voltage according to the amplification result to the other terminal of the capacitor.

Preferably, the input device may further include a detection current correction circuit which is provided with a node connected to a current path where the detection current flows from the current output circuit to the current-voltage conversion circuit or a current path where the drive current flows from the current output circuit to the detection electrode and outputs a correction current for decreasing the amplitude of the detection current from the node.

According to the above-described configuration, the correction current is supplied from the node connected to the current path, whereby the amplitude of the detection current decreases. For this reason, an error due to the parasitic capacitor apparently increasing the electrostatic capacitance value of the detection-target capacitor is correctable with a decrease in amplitude of the detection current. If the amplitude of the detection current decreases, the amplitude of the voltage output from the current-voltage conversion circuit decreases, and a margin of the output voltage of the current-voltage conversion circuit with respect to the power supply voltage range increases. For this reason, it is possible to further increase the amplitude of the detection voltage, and to further improve sensitivity.

Preferably, the detection current correction circuit may include a correction capacitor having one terminal connected to the node and the other terminal to which a correction voltage having a periodically changing level is applied.

Alternatively, the detection current correction circuit may include a correction capacitor, and a correction current output circuit which outputs a current to the correction capacitor such that a predetermined correction voltage having a periodically changing level is generated in the correction capacitor and outputs the correction current proportional to the current output to the correction capacitor from the node. In this case, the correction current output circuit may include an amplification circuit which amplifies the difference between the input correction voltage and a voltage generated in the correction capacitor and outputs a correction reference current according to the amplification result to the correction capacitor, and a current mirror circuit which outputs the correction current proportional to the correction reference current.

Preferably, the correction voltage may be equal to the detection voltage. With this, a circuit configuration is simplified.

Preferably, the input device may further include a shield electrode which is provided in proximity to the detection electrode and to which the detection voltage is applied.

With this, the influence of the parasitic capacitor formed by electrostatic coupling of an object other than the object to be detected with the detection electrode is reduced.

According to the invention, it is possible to detect minute electrostatic capacitance changing according to the proximity of the object with high sensitivity.

BRIEF DESCRIPTION OF THE DRAWINGS

FIG. 4A shows a voltage waveform, and FIG. 4B shows a current waveform;

FIG. 8A shows a voltage waveform, and FIG. 8B shows a current waveform;

FIG. 14A shows the configuration of a circuit, and FIG. 14B shows a voltage waveform of each unit.

DESCRIPTION OF THE PREFERRED EMBODIMENTS

First Embodiment

Figure 1:
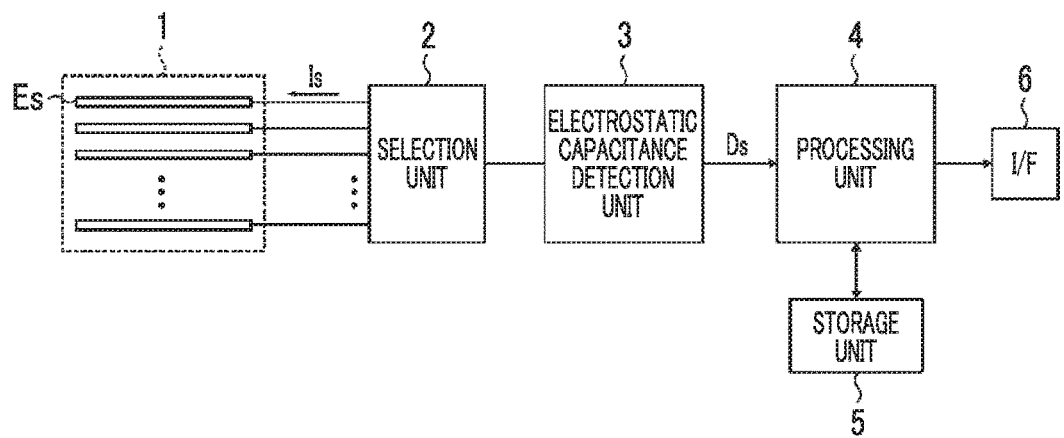
FIG. 1 is a diagram showing an example of the configuration of an input device according to an embodiment of the invention.

FIG. 1 is a diagram showing an example of the configuration of an input device according to this embodiment. The input device shown in FIG. 1 has an electrode unit 1, a selection unit 2, an electrostatic capacitance detection unit 3, a processing unit 4, a storage unit 5, and an interface unit 6.

If an object, such as a finger or a pen, is proximate to a detection electrode in the electrode unit 1, a capacitor formed between the detection electrode Es and the ground changes. The input device according to this embodiment detects and acquires, as information according to the proximity of the object, an electrostatic capacitance value of the capacitor formed between the detection electrode (Es) and the ground. For example, this embodiment is applied to a user interface device (touch pad, touch panel, or the like) which acquires information, such as the presence or absence of proximity of the object to the electrode unit 1, the proximity position of the object, the distance between the electrode unit 1 and the object, or the size of the object. In this specification, the term "proximity" includes both of a case where the object is close in a contact state and a case where the object is close in a non-contact state.

The electrode unit 1 has a plurality of detection electrodes Es for detecting the proximity of the object, such as a finger or a pen. For example, a plurality of detection electrodes Es are provided in a lattice shape along the surface of a detection area of the object. The position of the object in a vertical direction of the detection area is specified from the electrostatic capacitance values of the detection electrodes arranged in the vertical direction of the detection area. The position of the object in a horizontal direction of the detection area is specified from the electrostatic capacitance values of the detection electrodes arranged in the horizontal direction of the detection area.

The selection unit 2 is a circuit which selects one detection electrode Es from a plurality of detection electrodes Es in the electrode unit 1 and connects the detection electrode Es to the electrostatic capacitance detection unit 3, and switches connection under the control of the processing unit 4.

The electrostatic capacitance detection unit 3 detects electrostatic capacitance between the detection electrode Es connected thereto through the selection unit 2 and the ground, and acquires a detection value Ds indicating the detection result.

The processing unit 4 is a circuit which controls the overall operation of the input device, and includes, for example, a computer which performs processing according to a command code of a program stored in the storage unit 5, and a logic circuit which implements a specific function. The whole of the processing of the processing unit 4 may be implemented based on the program in the computer or a part or the whole of the processing may be implemented with a dedicated logic circuit.

The processing unit 4 performs control such that the selection unit 2 connects each detection electrode Es of the electrode unit 1 to the electrostatic capacitance detection unit 3 in order, detects the electrostatic capacitance value of each detection electrode Es in the electrostatic capacitance detection unit 3, and stores the detection value Ds in a predetermined data storage area of the storage unit 5. Then, the processing unit 4 calculates, based on the detection value Ds of each detection electrode Es stored in the storage unit 5, the coordinates where the object (finger or the like) is proximate to the detection area of the electrode unit 1. For example, the processing unit 4 calculates, based on a plurality of detection values Ds acquired for a plurality of detection electrodes Es arranged in the vertical direction, the coordinates in the vertical direction of the position where the object is proximate, and calculates, based on a plurality of detection values Ds acquired for a plurality of detection electrodes Es arranged in the horizontal direction, the coordinates in the horizontal direction of the position where the object is proximate. The processing unit 4 may calculate the size of the object, the distance from the electrode, or the like based on the detection value Ds of each detection electrode Es.

The storage unit 5 stores constant data or variable data used for the processing in the processing unit 4. In a case where the processing unit 4 includes a computer, the storage unit 5 may store a program which is executed on the computer. The storage unit 5 includes, for example, a volatile memory, such as a DRAM or a SRAM, a nonvolatile memory, such as a flash memory, a hard disk, or the like.

The interface unit 6 is a circuit which transfers data between the input device and other devices (a control IC of an information apparatus in which the input device is mounted, or the like). The processing unit 4 outputs information, such as the calculated coordinates of the proximity position of the object, the size of the object, and the distance from the detection electrode, from the interface unit 6 to a host device (not shown). In the host device, a user interface which recognizes, for example, a pointing operation, a gesture operation, or the like using these kinds of information is constructed.

Next, a main part of this embodiment including the electrode unit 1 and the electrostatic capacitance detection unit 3 will be described in more detail.

Figure 2:
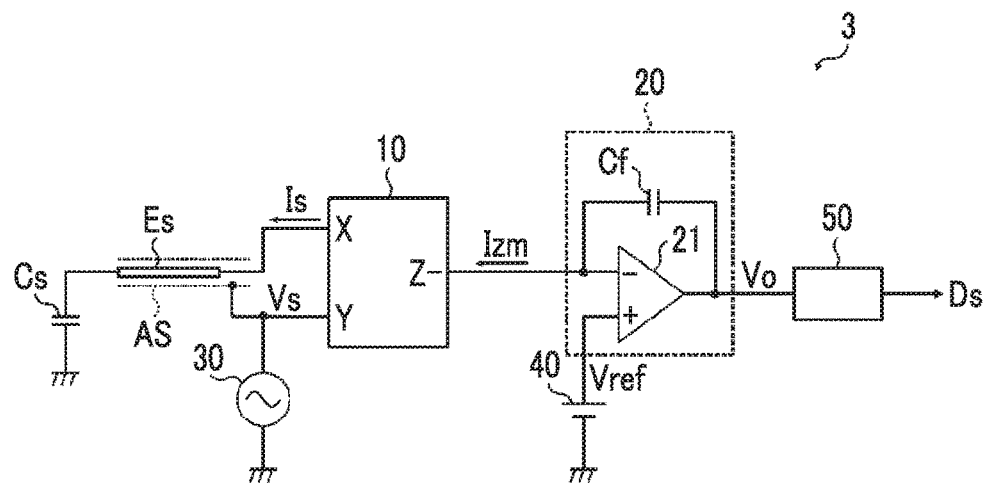
FIG. 2 is a diagram showing a configuration example of a main part of an input device according to the first embodiment.

FIG. 2 is a diagram showing a configuration example of a main part of an input device according to a first embodiment, and shows a more detailed configuration of the electrode unit 1 and the electrostatic capacitance detection unit 3. In FIG. 2, the selection unit 2 is not shown, and a state where one detection electrode Es is connected to the electrostatic capacitance detection unit 3 by the selection unit 2 (not shown) is shown.

The electrode unit 1 has a shield electrode AS which is provided in proximity to each detection electrode Es. The shield electrode AS is an electrostatic shield which prevents an object (for example, a peripheral electronic component or the like) other than the object to be detected from being electrostatically coupled with the detection electrode Es. The shield electrode AS is provided so as to cover at least a part of the periphery of the detection electrode Es excluding a portion where the object to be detected is proximate. The shield electrode AS is provided, whereby a parasitic capacitor having no relation with a capacitor (hereinafter, also referred to as a "detection-target capacitor Cs") formed between the object to be detected and the detection electrode Es is hardly formed.

A detection voltage Vs of a voltage generation circuit 30 described below is applied to the shield electrode AS. While a capacitor is also formed between the detection electrode Es and the shield electrode AS, since the detection electrode Es is controlled to have the same potential as the shield electrode As as described below, no current flows in the capacitor. Accordingly, the capacitor formed between the detection electrode Es and the shield electrode AS does not almost affect the detection value of the electrostatic capacitance detection unit 3.

In the example of FIG. 2, the electrostatic capacitance detection unit 3 has a current output circuit 10, a current-voltage conversion circuit 20, voltage generation circuit 30 and 40, and a detection value acquisition unit 50.

The current output circuit 10 outputs a drive current Is to the detection electrode Es such that a voltage which is substantially equal to the detection voltage Vs supplied from the voltage generation circuit 30 is generated in the detection electrode Es, and outputs a detection current Izm proportional to the drive current Is.

Figure 3:
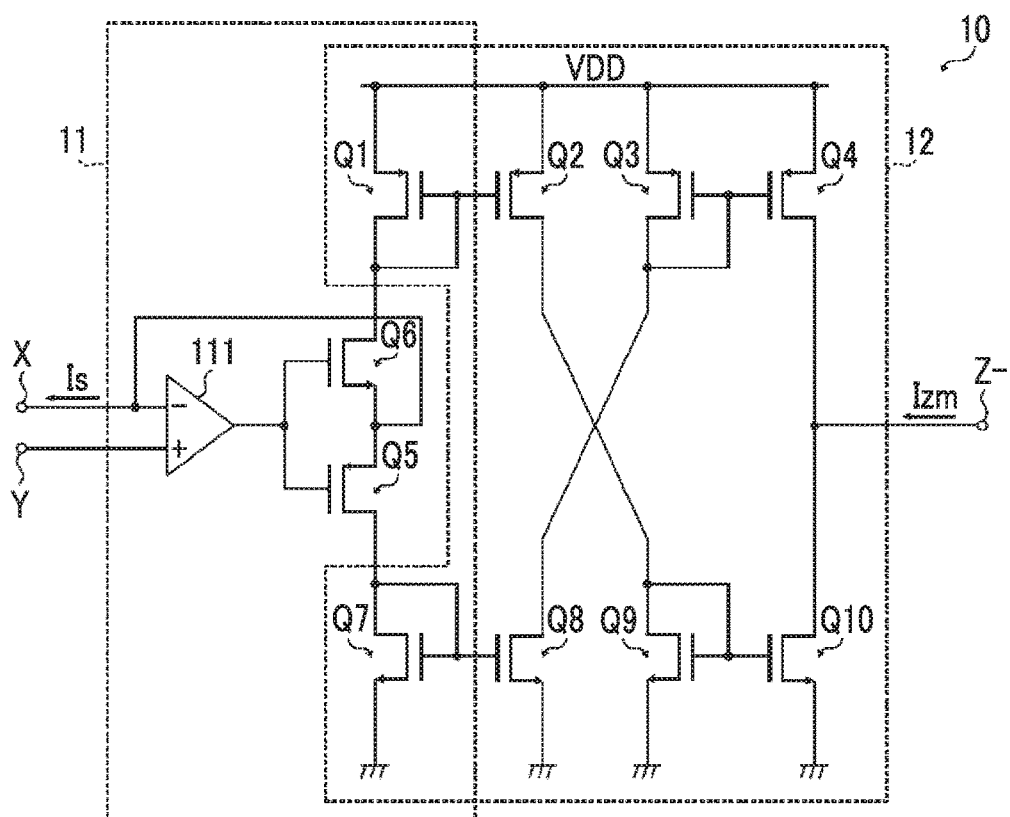
FIG. 3 is a diagram showing an example of the configuration of a current output circuit.

FIG. 3 is a diagram showing an example of the configuration of the current output circuit 10. The current output circuit 10 shown in FIG. 3 has an amplification circuit 11 and a current mirror circuit 12.

The amplification circuit 11 is, for example, an operational transconductance amplifier (OTA), amplifies the difference between the detection voltage Vs input to a terminal Y and a voltage of the detection electrode Es connected to a terminal X, and outputs the drive current Is according to the amplification result from the terminal X to the detection electrode Es.

In the example of FIG. 3, the amplification circuit 11 has transistors Q1, Q5, Q6, and Q7 and a differential amplifier 111. The transistors Q1 and Q5 are, for example, P-type MOS transistors, and the transistors Q6 and Q7 are, for example, N-type MOS transistors. The inverting input terminal of the differential amplifier 111 is connected to the terminal X, the non-inverting input terminal of the differential amplifier 111 is connected to the terminal Y, and the output terminal of the differential amplifier 111 is connected to the gates of the transistors Q5 and Q6. The sources of the transistor Q5 and the transistor Q6 are connected in common at a common node, and the common node is connected to the inverting input terminal of the differential amplifier 111. The drain of the transistor Q5 is connected to a ground GND through the transistor Q7, and the drain of the transistor Q6 is connected to a power supply voltage VDD through the transistor Q1. The source of the transistor Q1 is connected to the power supply voltage VDD, and the drain and the gate of the transistor Q1 are connected to the drain of the transistor Q6. The source of the transistor Q7 is connected to the ground GND, and the drain and the gate of the transistor Q7 are connected to the drain of the transistor Q5.

If the detection voltage Vs input to the terminal Y becomes higher than the voltage of the detection electrode Es, the output voltage of the differential amplifier 111 increases and a drain current of the transistor Q6 increases. For this reason, the drive current Is in a direction of output from power supply voltage VDD to the terminal X through the transistors Q1 and Q6 increases. If the drive current Is flows in this direction, since the detection-target capacitor Cs is charged, the voltage of the detection electrode Es increases, and the difference between the detection voltage Vs and the voltage of the detection electrode Es decreases.

If the detection voltage Vs becomes lower than the voltage of the detection electrode Es, the output voltage of the differential amplifier 111 decreases and the drain current of the transistor Q5 increases. For this reason, the drive current Is in a direction of leading from the terminal X to the ground GND through the transistors Q5 and Q7 increases. If the drive current Is flows in this direction, since the detection-target capacitor Cs is discharged, the voltage of the detection electrode Es decreases, and the difference between the detection voltage Vs and the voltage of the detection electrode Es decreases.

If it is assumed that the gain of the differential amplifier 111 is sufficiently large, the voltage of the detection electrode Es becomes substantially equal to the detection voltage Vs. In this case, since a voltage which is substantially equal to the detection voltage Vs is generated in the detection-target capacitor Cs, the drive current Is becomes an AC current which vibrates in the same period as the detection voltage Vs.

The current mirror circuit 12 outputs the detection current Izm proportional to the drive current Is output from the amplification circuit 11.

The current mirror circuit 12 shown in the example of FIG. 3 has transistors Q1, Q2, Q3, Q4, Q7, Q8, Q9, and Q10. The transistors Q1 to Q4 are, for example, P-type MOS transistors, and the transistors Q7 to Q10 are, for example, N-type MOS transistors. The transistors Q1 and Q7 are constituent elements included in both of the amplification circuit 11 and the current mirror circuit 12.

The source of the transistor Q2 is connected to the power supply voltage VDD, the gate of the transistor Q2 is connected to the gate of the transistor Q1, and the drain of the transistor Q2 is connected to the drain of the transistor Q9. The gate and the drain of the transistor Q9 are connected in common, and the source of the transistor Q9 is connected to the ground GND. The source of the transistor Q10 is connected to the ground GND, the gate of the transistor Q10 is connected to the gate of the transistor Q9, and the drain of the transistor Q10 is connected to a terminal Z−.

The source of the transistor Q8 is connected to the ground GND, the gate of the transistor Q8 is connected to the gate of the transistor Q7, and the drain of the transistor Q8 is connected to the drain of the transistor Q3. The gate and the drain of the transistor Q3 are connected in common, and the source of the transistor Q3 is connected to the power supply voltage VDD. The source of the transistor Q4 is connected to the power supply voltage VDD, the gate of the transistor Q4 is connected to the gate of the transistor Q3, and the drain of the transistor Q4 is connected to the terminal Z−.

An operation will be described on the assumption that each transistor included in the current mirror circuit 12 operates in a saturation area. In the transistor Q1, the same drain current as in the transistor Q6 flows. A voltage according to the drain current is generated between the gate and the source of the transistor Q1. Since the gate-source voltage of the transistor Q2 is equal to the gate-source voltage of the transistor Q1, the drain current of the transistor Q2 is proportional to the drain current of the transistor Q1. In the transistor Q9, the same drain current as in the transistor Q2 flows. A voltage according to the drain current is generated between the gate and the source of the transistor Q9. Since the gate-source voltage of the transistor Q10 is equal to the gate-source voltage of the transistor Q9, the drain current of the transistor Q10 is proportional to the drain current of the transistor Q9. Accordingly, the drain current of the transistor Q10 is proportional to the drain current of the transistor Q6.

The drain currents of the transistors Q7 and Q8 and the drain currents of the transistors Q3 and Q4 are in a proportional relationship with the same operation as described above. For this reason, the drain current of the transistor Q5 is proportional to the drain current of the transistor Q4.

Accordingly, if the drive current Is flows in a direction of ejection from the power supply voltage VDD to the terminal X, the detection current Izm proportional to the drive current Is flows in a direction of leading from the terminal Z− to the ground GND. If the drive current Is flows in a direction of leading from the terminal X to the ground GND, the detection current Izm proportional to the drive current Is flows in a direction of ejection from the power supply voltage VDD to the terminal Z−.

The above is the description of the current output circuit 10.

Returning to FIG. 2, description will be continued. The voltage generation circuit 30 generates the detection voltage Vs having a periodically changing level. For example, the detection voltage Vs has a waveform vibrating in a sine wave shape with an amplitude close to a voltage width from a lowest potential (GND) to a highest potential (VDD) of a power supply voltage range centering on an intermediate voltage of the power supply voltage range. However, in the invention, the detection voltage Vs is not limited to a sine wave, and may be, for example, a square wave or a triangular wave.

The voltage generation circuit 40 generates a given reference voltage Vref. The reference voltage Vref is set to, for example, the intermediate voltage of the power supply voltage range (GND to VDD).

The current-voltage conversion circuit 20 outputs a voltage Vo according to the detection current Izm output from the current output circuit 10. For example, as shown in FIG. 2, the current-voltage conversion circuit 20 has a capacitor Cf and a third amplification circuit 21. The detection current Izm is input to one terminal of the capacitor Cf, and the voltage Vo is applied to the other terminal of the capacitor Cf. The third amplification circuit 21 amplifies the voltage difference between the voltage of one terminal of the capacitor Cf to which the detection current Izm is input and the reference voltage Vref supplied from the voltage generation circuit 40 and outputs the voltage Vo according to the amplification result. The third amplification circuit 21 is, for example, an operational amplifier or an OTA, the capacitor Cf is connected between the inverting input terminal and the output terminal of the third amplification circuit 21, and the reference voltage Vref is input to the non-inverting input terminal of the third amplification circuit 21. In a case where the gain of the third amplification circuit 21 is sufficiently large, an AC voltage according to the detection current Izm is generated across both ends of the capacitor Cf. The voltage Vo is a voltage obtained by adding the AC voltage generated in the capacitor Cf and the reference voltage Vref, and the waveform of the voltage Vo vibrates centering on the reference voltage Vref.

The current-voltage conversion circuit 20 may have an inductance element, such as a resistor, instead of the capacitor Cf. Even in this case, since the AC voltage according to the detection current Izm is generated across both ends of the inductance element, the voltage Vo according to the detection current Izm is obtained.

The detection value acquisition unit 50 acquires the detection value Ds according to the electrostatic capacitance value of the detection-target capacitor Cs based on the voltage Vo output from the current-voltage conversion circuit 20. For example, the detection value acquisition unit 50 multiplies an AC component included in the voltage Vo by an AC signal having the same period as the detection voltage Vs and integrates the multiplication result to acquire the detection value Ds proportional to the amplitude of the AC component. The detection value acquisition unit 50 includes, for example, an A/D converter, converts the detection value Ds from an analog value to a digital value, and outputs the detection value Ds to the processing unit 4.

Figure 4A:
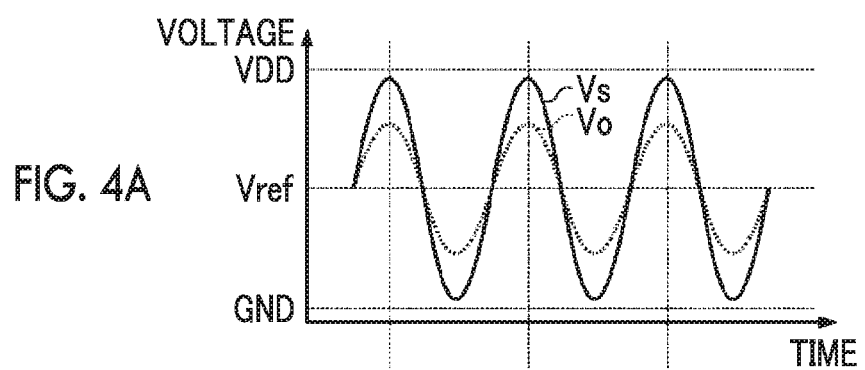
FIGS. 4A and 4B are diagrams showing examples of a voltage waveform and a current waveform of each unit in an electrostatic capacitance detection unit.
Figure 4B:
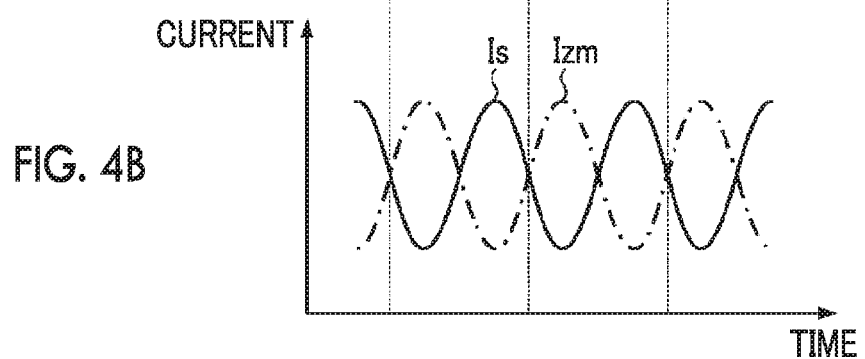

A detection operation of the electrostatic capacitance value in the input device according to this embodiment having the above-described configuration will be described. FIGS. 4A and 4B are diagrams showing examples of a voltage waveform and a current waveform of each unit in the electrostatic capacitance detection unit 3 of the input device. FIG. 4A shows the waveforms of the detection voltage Vs and the voltage Vo, and FIG. 4B shows the waveforms of the drive current Is and the detection current Izm.

Since the drive current Is is supplied from the current output circuit 10 to the detection electrode Es such that the voltage of the detection electrode Es becomes substantially equal to the detection voltage Vs, in a case where the detection voltage Vs has a waveform of a sine wave shown in FIG. 4A, a voltage of a sine wave which is substantially equal to the detection voltage Vs is generated in the detection-target capacitor Cs. A current flowing in the detection-target capacitor Cs, that is, the drive current Is has a phase advanced by 90 degrees with respect to the detection voltage Vs as shown in FIG. 4B. The detection current Izm is proportional to the drive current Is, and the direction of the detection current Izm is as indicated by an arrow shown in FIG. 2. In a case where the direction of ejection of the current from the current output circuit 10 is defined to be positive, as shown in FIG. 4B, the detection current Izm has a phase reverse to the drive current Is.

Since almost all the detection current Izm output from the current output circuit 10 flow in the capacitor Cf, an AC voltage having an amplitude proportional to the detection current Izm is generated across both ends of the capacitor Cf. The voltage Vo of the output terminal of the third amplification circuit 21 is a voltage obtained by adding the AC voltage generated across both ends of the capacitor Cf and the reference voltage Vref, and vibrates centering on the reference voltage Vref. The phase of the AC voltage generated across both ends of the capacitor Cf is delayed by 90 degrees with respect to the detection current Izm flowing in the capacitor Cf. For this reason, the AC component of the voltage Vo has the substantially same phase as that of the detection voltage Vs as shown in FIG. 4A.

In a case where a current conversion ratio (detection current Izm/drive current Is) in the current mirror circuit 12 is referred to as "α", and the electrostatic capacitance value of the capacitor Cf is referred to as "C", the voltage Vo is represented by the following expression:

$$Vo = C \times \int \{\alpha \times Is\} dt + Vref \quad (1)$$

Since the drive current Is has a waveform obtained by differentiating the detection voltage Vs and increases in proportion to the detection voltage Vs, the amplitude of the voltage Vo also increases in proportion to the detection voltage Vs. However, the amplitude of the voltage Vo can be appropriately adjusted by decreasing the capacitance value of the capacitor Cf or decreasing the current conversion ratio α. For this reason, even if the amplitude of the detection voltage Vs increases to a maximum of the power supply voltage range, it is possible to adjust the amplitude of the voltage Vo so as not to exceed the power supply voltage range.

As described above, according to the input device of this embodiment, the drive current Is flows from the current output circuit 10 to the detection electrode Es such that the voltage which is substantially equal to the detection voltage Vs having a periodically changing level is generated in the detection electrode Es. The drive current Is flows in the detection-target capacitor Cs, and thus, has a value proportional to the electrostatic capacitance value of the detection-target capacitor Cs. The detection current Izm output from the current output circuit 10 is proportional to the drive current Is, and thus, has a value proportional to the electrostatic capacitance value of the detection-target capacitor Cs. Therefore, it is possible to acquire the electrostatic capacitance value of the detection-target capacitor Cs based on the detection current Izm, in other words, to acquire information according to the proximity of the object.

According to the input device of this embodiment, in a case where the amplitude of the detection voltage Vs is increased, since the amplitude of the drive current Is flowing in the detection-target capacitor Cs increases, the amplitude of the detection current Izm also increases. In this case, the increase in amplitude of the detection current Izm is not directly restricted by the condition of the power supply voltage range (GND to VDD) that enables a circuit to operate. For this reason, for example, the current conversion ratio "a" of the current output circuit 10, the capacitance value "C" of the capacitor Cf of the current-voltage conversion circuit 20, or the like is set to an appropriate value so as not to cause the voltage Vo to exceed the power supply voltage range (GND to VDD), whereby it is possible to prevent the amplitude of the detection current Izm from being restricted by the condition of the power supply voltage range (GND to VDD). Therefore, since it is possible to increase the amplitude of the detection voltage Vs to the maximum of the power supply voltage range, it is possible to increase the detection sensitivity of the detection-target capacitor Cs.

Next, modification examples of this embodiment will be described.

Modification Example 1

Figure 5:
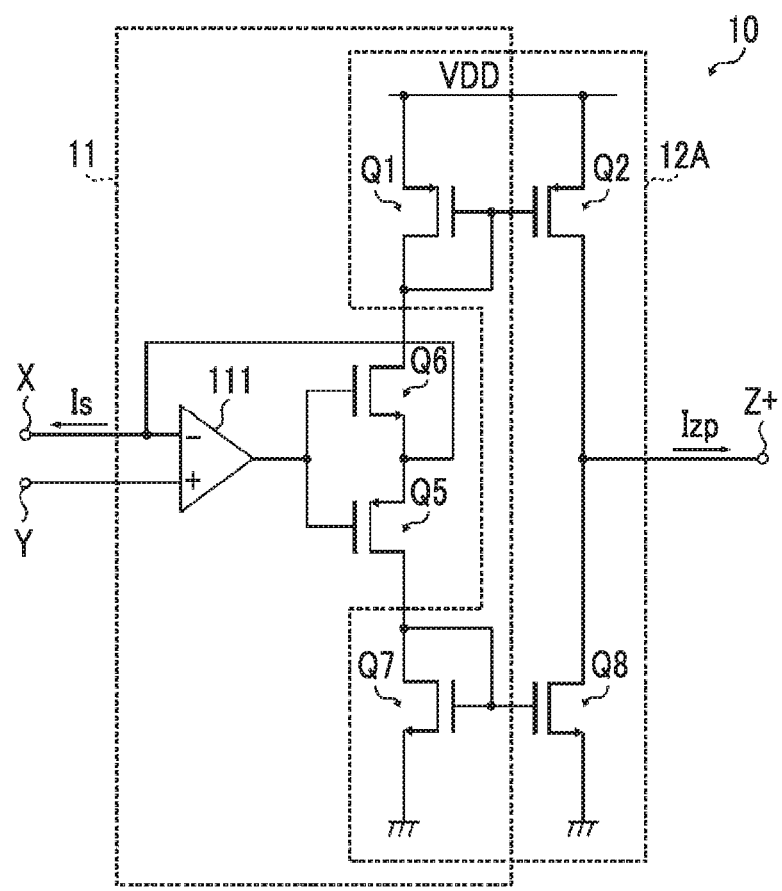
FIG. 5 is a diagram showing a modification example of the current output circuit.

FIG. 5 is a diagram showing a modification example of the current output circuit 10. The current output circuit 10 shown in FIG. 5 has a configuration in which the two-stage current mirror circuit 12 in the current output circuit 10 shown in FIG. 3 is changed to a one-stage current mirror circuit 12A.

The current mirror circuit 12A has transistors Q1, Q2, Q7, and Q8 the same as those in the current mirror circuit 12. However, the current mirror circuit 12A is different from the current mirror circuit 12 in that the drains of the transistor Q2 and the transistor Q8 are respectively connected to a terminal Z+ and a detection current Izp is output from the terminal Z+.

If the drive current Is flows in a direction of ejection from the power supply voltage VDD to the terminal X, the detection current Izp proportional to the drive current Is flows in a direction of ejection from the power supply voltage VDD to the terminal Z+. If the drive current Is flows in a direction of leading from the terminal X to the ground GND, the detection current Izp proportional to the drive current Is flows in a direction of leading from the terminal Z+ to the ground GND. Accordingly, the detection current Izp of the current mirror circuit 12A has a phase reverse to the detection current Izm of the current mirror circuit 12, and the AC component of the voltage Vo also has a reverse phase.

As in this modification example, even in a case where the AC component of the voltage Vo has a phase reverse to the detection voltage Vs, since it is possible to acquire the electrostatic capacitance value of the detection-target capacitor Cs from the AC component, the same effects as in the above-described embodiment are obtained.

Modification Example 2

Figure 6:
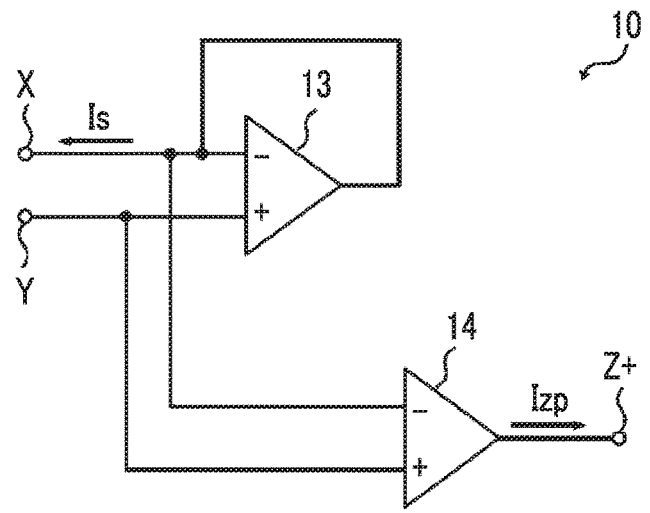
FIG. 6 is a diagram showing another modification example of the current output circuit.

FIG. 6 is a diagram showing another modification example of the current output circuit 10. The current output circuit 10 shown in FIG. 6 has a first amplification circuit 13 and a second amplification circuit 14.

The first amplification circuit 13 amplifies the difference between the detection voltage Vs input to the terminal Y and the voltage of the detection electrode Es connected to the terminal X, and outputs the drive current Is according to the amplification result from the terminal X to the detection electrode Es. The first amplification circuit 13 is, for example, an OTA, the inverting input terminal and the output terminal of the first amplification circuit 13 are connected to the terminal X, and the non-inverting input terminal of the first amplification circuit 13 is connected to the terminal Y.

The second amplification circuit 14 amplifies the difference between the detection voltage Vs input to the terminal Y and the voltage of the detection electrode Es connected to the terminal X, and outputs the detection current Izp according to the amplification result from the terminal Z+ to the current-voltage conversion circuit 20. The second amplification circuit 14 is, for example, an OTA, the inverting input terminal of the second amplification circuit 14 is connected to the terminal X, the non-inverting input terminal of the second amplification circuit 14 is connected to the terminal Y, and the output terminal of the second amplification circuit 14 is connected to the terminal Z+.

The second amplification circuit 14 is configured of a circuit having the substantially same characteristics as the first amplification circuit 13, whereby it is possible to provide the detection current Izp having a value substantially equal to the drive current Is (or a value proportional to the drive current Is). Even in Modification Example 2, as in Modification Example 1 described above, the AC component of the voltage Vo has a phase reverse to the detection voltage Vs.

Second Embodiment

Figure 7:
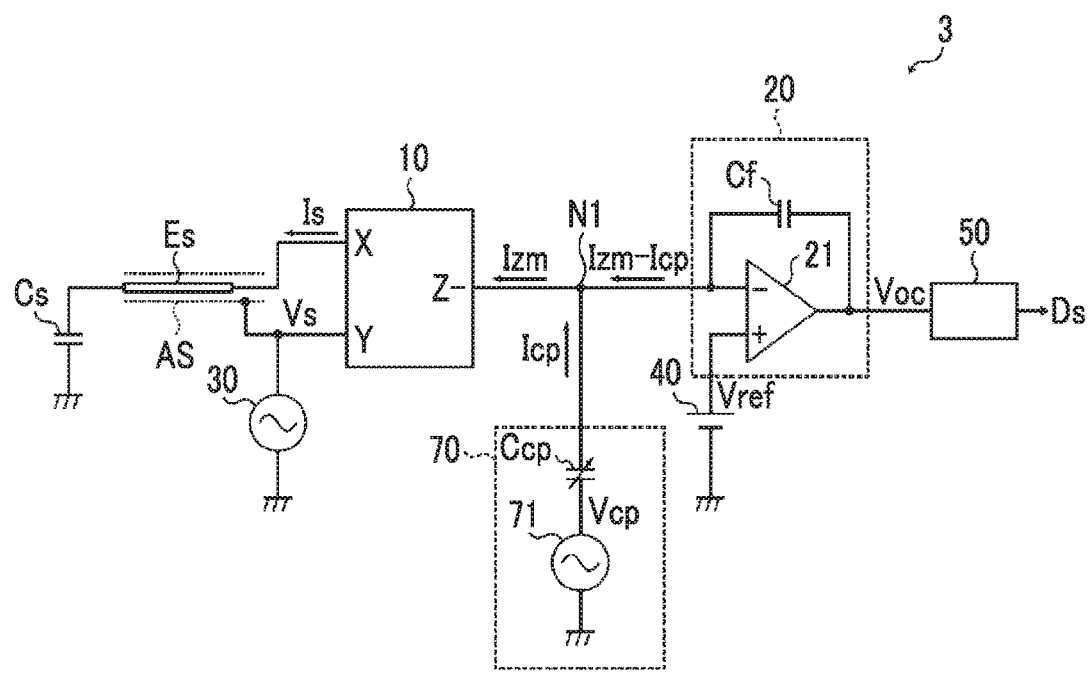
FIG. 7 is a diagram showing a configuration example of a main part of an input device according to a second embodiment.

Next, a second embodiment of the invention will be described. FIG. 7 is a diagram showing a configuration example of a main part of an input device according to the second embodiment. The overall configuration of the input device is the same as that of FIG. 1.

An electrostatic capacitance detection unit 3 shown in FIG. 7 has a detection current correction circuit 70, in addition to the same configuration as the electrostatic capacitance detection unit 3 shown in FIG. 2. The detection current correction circuit 70 is a circuit which corrects an error due to a parasitic capacitor provided in parallel with the detection-target capacitor Cs. The detection current correction circuit 70 includes a node N1 which is connected to a current path where the detection current Izm flows from the current output circuit 10 to the current-voltage conversion circuit 20, and outputs a correction current Icp for decreasing the amplitude of the detection current Izm from the node N1.

In the example of FIG. 7, the detection current correction circuit 70 has a correction capacitor Ccp and a voltage generation circuit 71. One terminal of the correction capacitor Ccp is connected to the node N1, and a correction voltage Vcp of the voltage generation circuit 71 is applied to the other terminal of the correction capacitor Ccp. The correction voltage Vcp is a voltage having a periodically changing level, and for example, is a voltage which includes an AC component having the same phase as that of the detection voltage Vs.

Figure 8:
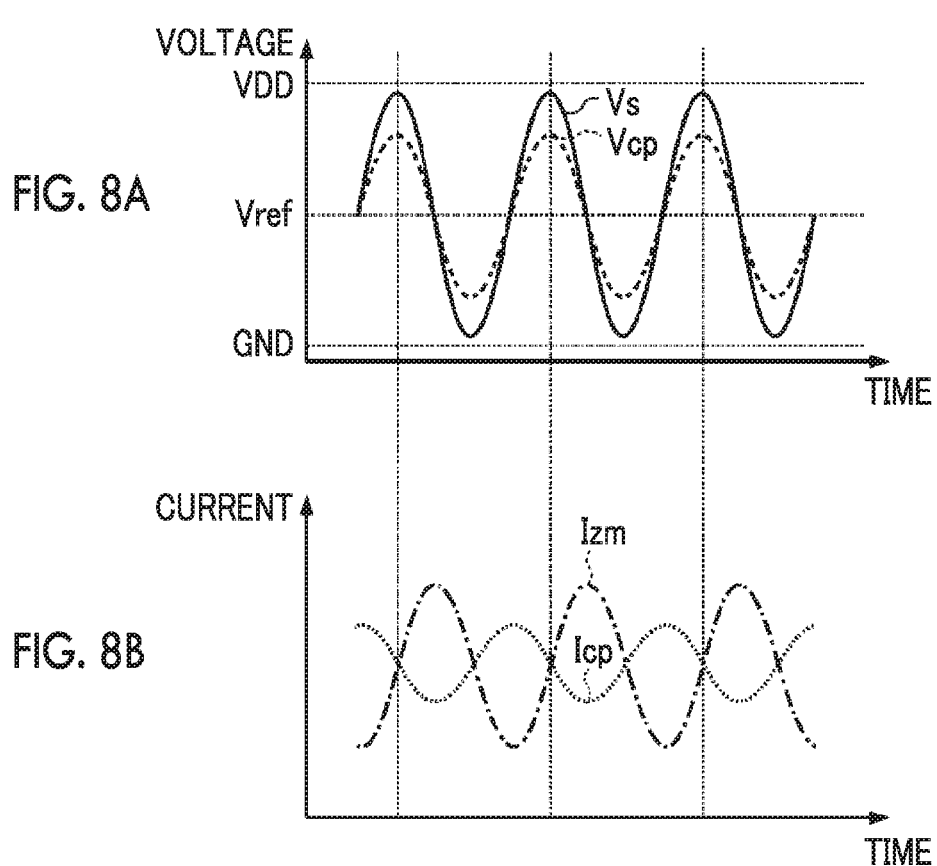
FIGS. 8A and 8B are diagrams showing examples of a voltage waveform and a current waveform of each unit of an electrostatic capacitance detection unit in a case where correction of a detection current is performed.

FIGS. 8A and 8B are a diagram showing examples of a voltage waveform and a current waveform of each unit of the electrostatic capacitance detection unit 3 in a case where correction of the detection current Izm is performed. FIG. 8A shows the voltage waveforms of the detection voltage Vs and the correction voltage Vcp, and FIG. 8B shows the waveforms of the detection current Izm and the current Icp of the correction capacitor Ccp.

The node N1 is fixed to a given voltage substantially equal to the reference voltage Vref by the third amplification circuit 21 of the current-voltage conversion circuit 20. For this reason, as shown in FIG. 8B, the correction current Icp corresponding to a differential waveform of the AC component of the correction voltage Vcp flows in the correction capacitor Ccp. The correction current Icp is supplied to the node N1, whereby a detection current (Izm−Icp) which decreases in amplitude by the correction current Icp with respect to the detection current Izm is input to the current-voltage conversion circuit 20.

Figure 9:
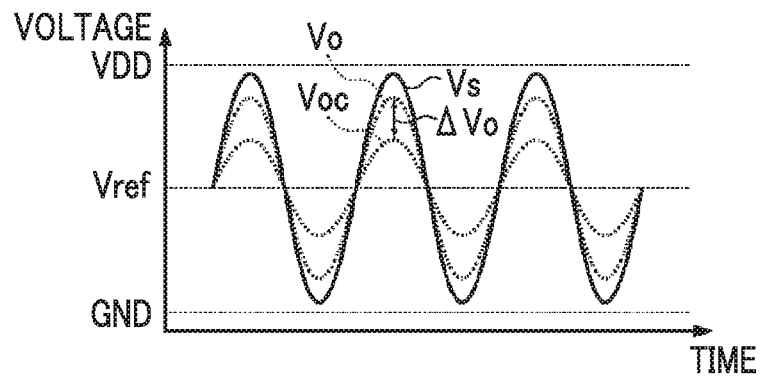
FIG. 9 is a diagram showing a difference in output waveform of a current-voltage conversion circuit in a case where correction of the detection current is performed and a case where correction is not performed.

FIG. 9 is a diagram showing a difference in output waveform of the current-voltage conversion circuit 20 in a case where correction of the detection current Izm is performed and a case where correction is not performed. As shown in FIG. 9, an output voltage Voc of the current-voltage conversion circuit 20 in a case where correction of the detection current Izm is performed by the correction capacitor Ccp becomes smaller by "ΔVo" than the voltage Vo in a case where correction is not performed. "ΔVo" is set to be equal to the error due to the parasitic capacitor by adjusting the capacitance value of the correction capacitor Ccp or the amplitude of the correction voltage Vcp.

According to the input device of this embodiment, the correction current Icp is supplied to the node N1 on the current path where the detection current Izm flows, whereby the amplitude of the detection current input to the current-voltage conversion circuit 20 decreases. For this reason, it is possible to correct an error due to a parasitic capacitor apparently increasing the electrostatic capacitance value of the detection-target capacitor Cs with the decrease in amplitude of the detection current. The amplitude of the detection current decreases, whereby the amplitude of the voltage Voc output from the current-voltage conversion circuit 20 decreases and a margin of the output voltage Voc of the current-voltage conversion circuit 20 with respect to the power supply voltage range (GND to VDD) increases. For this reason, it is possible to further increase the amplitude of the detection voltage Vs, and to further improve sensitivity.

In the example of FIG. 7, although the current output circuit 10 which outputs the detection current Izm in a reverse direction to the drive current Is is used, for example, even in a case where the current output circuit 10 shown in FIG. 5 or 6 is used, correction of the detection current Izp is possible. In this case, since the detection current Izp flows in the same direction as the drive current Is, the voltage generation circuit 71 should generate the correction voltage Vcp including an AC component having a phase reverse to the detection voltage Vs.

Figure 10:
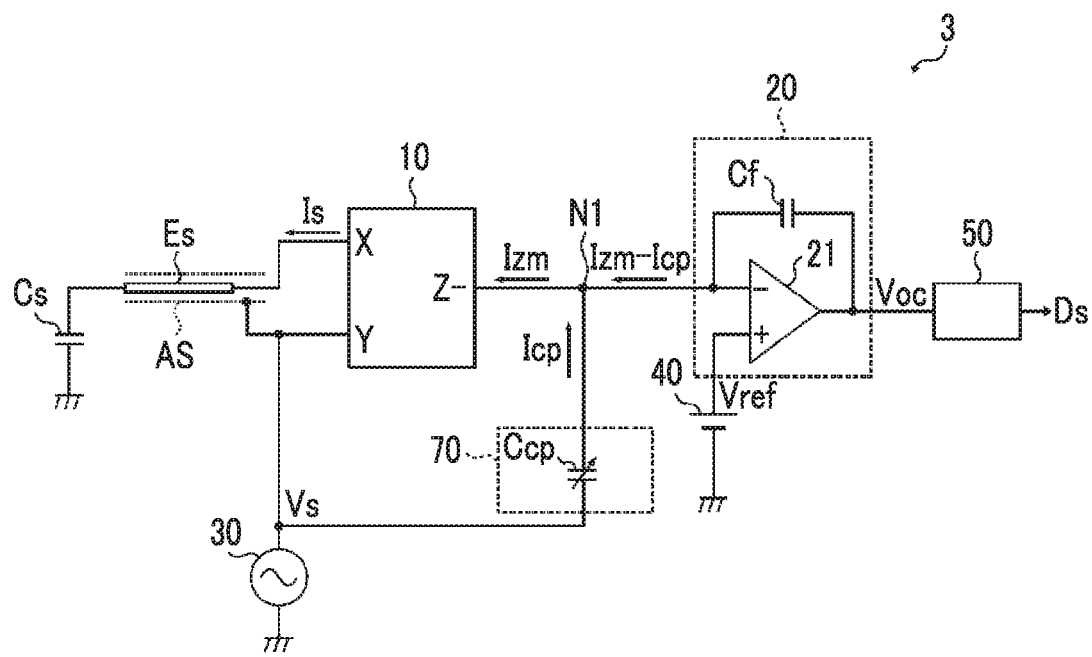
FIG. 10 is a diagram showing a configuration example in a case where a detection voltage and a correction voltage are made common in an electrostatic capacitance detection unit shown in FIG. 7.

In the example of FIG. 7, although the detection voltage Vs and the correction voltage Vcp are respectively generated by different voltage generation circuits, if adjustment of the electrostatic capacitance value of the correction capacitor Ccp is possible, as shown in FIG. 10, the detection voltage Vs and the correction voltage Vcp may be generated by the common voltage generation circuit 30. With this, it is possible to simplify a circuit configuration.

Third Embodiment

Figure 11:
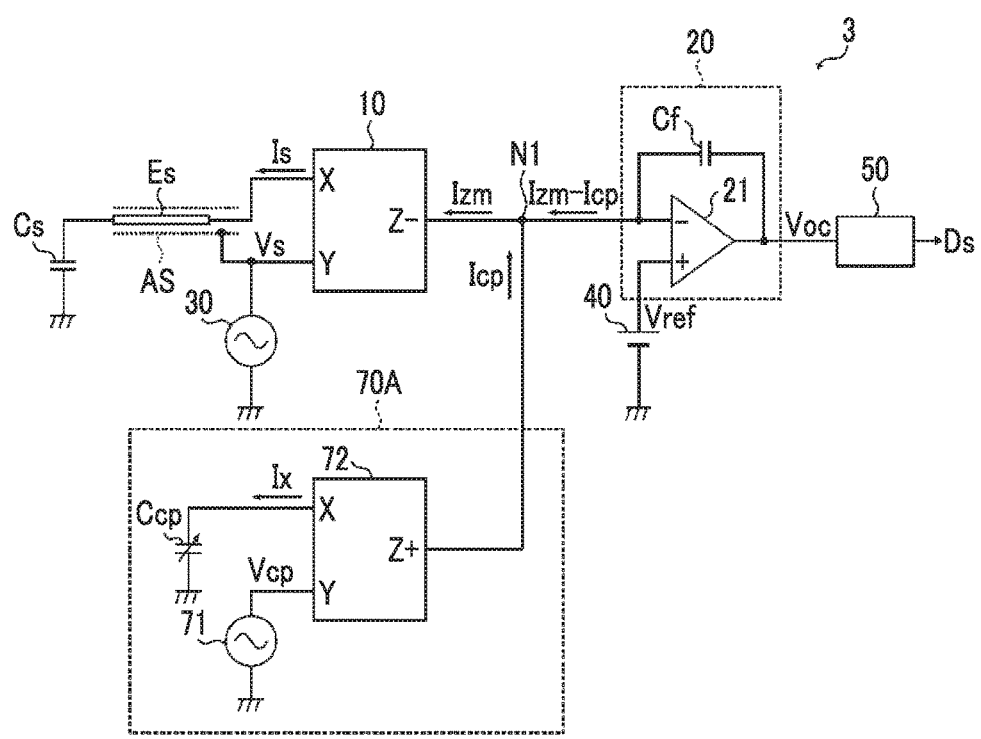
FIG. 11 is a diagram showing a configuration example of a main part of an input device according to a third embodiment.

Next, a third embodiment of the invention will be described. FIG. 11 is a diagram showing a configuration example of a main part of an input device according to the third embodiment. The overall configuration of the input device is the same as that of FIG. 1.

An electrostatic capacitance detection unit 3 shown in FIG. 11 has a configuration in which the detection current correction circuit 70 in the electrostatic capacitance detection unit 3 shown in FIG. 7 is replaced with a detection current correction circuit 70A. The detection current correction circuit 70A has a correction capacitor Ccp, a correction current output circuit 72, and a voltage generation circuit 71.

The correction current output circuit 72 outputs a current Ix to the correction capacitor Ccp such that a voltage substantially equal to the correction voltage Vcp supplied from the voltage generation circuit 72 is generated in the correction capacitor Ccp, and outputs a correction current Icp proportional to the current Ix from the node N1. The correction current output circuit 72 has, for example, the same configuration as that of FIG. 5 or 6 described above, the correction capacitor Ccp is connected between the terminal X and the ground, the correction voltage Vcp is input to the terminal Y, and the terminal Z+ is connected to the node N1.

The correction voltage Vcp generated in the correction current output circuit 72 is a voltage having a periodically changing level, and for example, is a voltage which includes an AC component having the same phase as that of the detection voltage Vs.

Since a voltage substantially equal to the correction voltage Vcp is generated in the correction capacitor Ccp, the current Ix corresponding to a differential waveform of the AC component of the correction voltage Vcp flows in the correction capacitor Ccp. The correction current Icp proportional to the current Ix is supplied to the node N1, whereby a detection current (Izm–Icp) which decreases in amplitude by the correction current Icp with respect to the detection current Izm is input to the current-voltage conversion circuit 20. Accordingly, the output voltage Voc of the current-voltage conversion circuit 20 becomes small compared to a case where there is no correction current Icp. The capacitance value of the correction capacitor Ccp or the amplitude of the correction voltage Vcp is adjusted such that the decrease (ΔVo) of the output voltage Voc becomes equal to the error of the parasitic capacitor.

Even in the input device having the above-described configuration, similarly to the input device according to the second embodiment, it is possible to provide a margin of the amplitude of the output voltage Voc of the current-voltage conversion circuit 20 with respect to the power supply voltage range while correcting the error due to the parasitic capacitor. Therefore, it is possible to further increase the amplitude of the detection voltage Vs, and to achieve improvement of sensitivity.

With the use of the correction current output circuit 72, since it is possible to adjust a current conversion ratio (correction current Icp/current Ix), even in a case where an adjustment range of the correction capacitor Ccp is limited, it is possible to adjust the amplitude of the correction current Icp in a wide range. Therefore, it is possible to appropriately correct the error of the parasitic capacitor.

Modification examples of this embodiment will be described.

Modification Example 1

Figure 12:
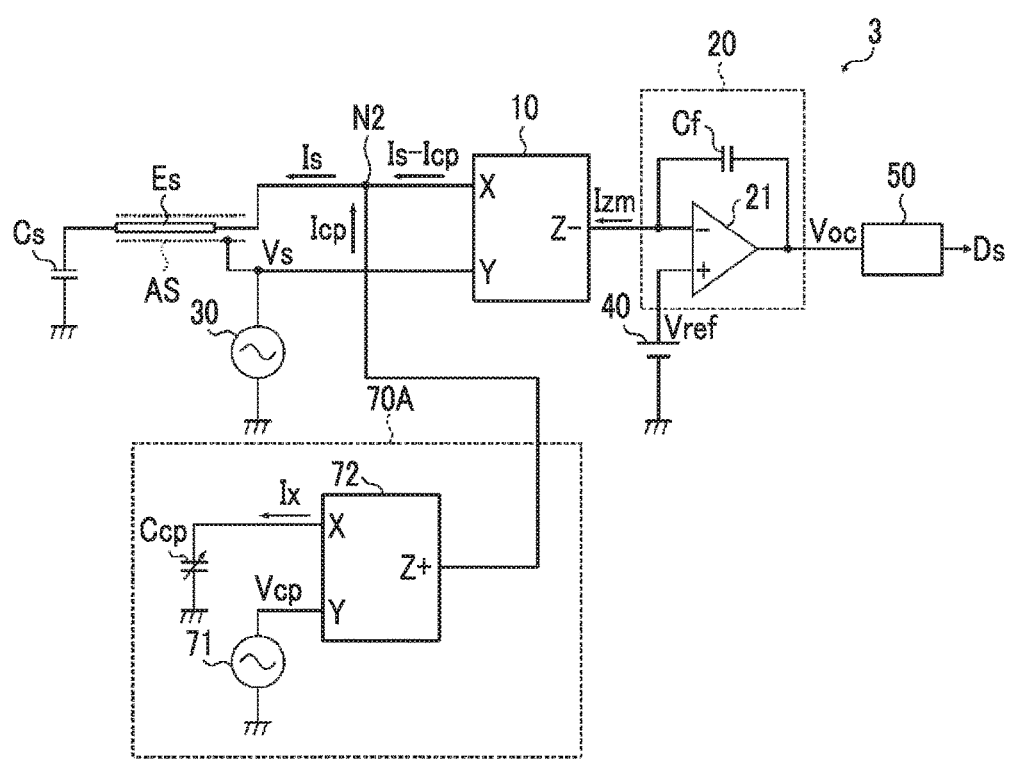
FIG. 12 is a diagram showing an example where a correction current is supplied to a node on a current path where a drive current flows from a current output circuit to a detection electrode.

In the electrostatic capacitance detection unit 3 shown in FIG. 11, although the correction current Icp is supplied to the node N1 on the current path of the detection current Izp flowing from the current output circuit 10 to the current-voltage conversion circuit 20, for example, as shown in FIG. 12, the correction current Icp may be supplied to a node N2 on the current path of the drive current Is flowing from the current output circuit 10 to the detection electrode Es. In this case, since the drive current output from the current-voltage conversion circuit 20 decreases in amplitude by the correction current Icp with respect to the drive current Is flowing into the detection electrode Es (Is–Icp), the amplitude of the detection current Izm flowing from the current output circuit 10 to the current-voltage conversion circuit 20 also decreases by the correction current Icp. Accordingly, as in the above-described embodiment, it is possible to provide a margin of the amplitude of the output voltage Voc of the current-voltage conversion circuit 20 with respect to the power supply voltage range while correcting the error due to the parasitic capacitor.

Modification Example 2

Figure 13:
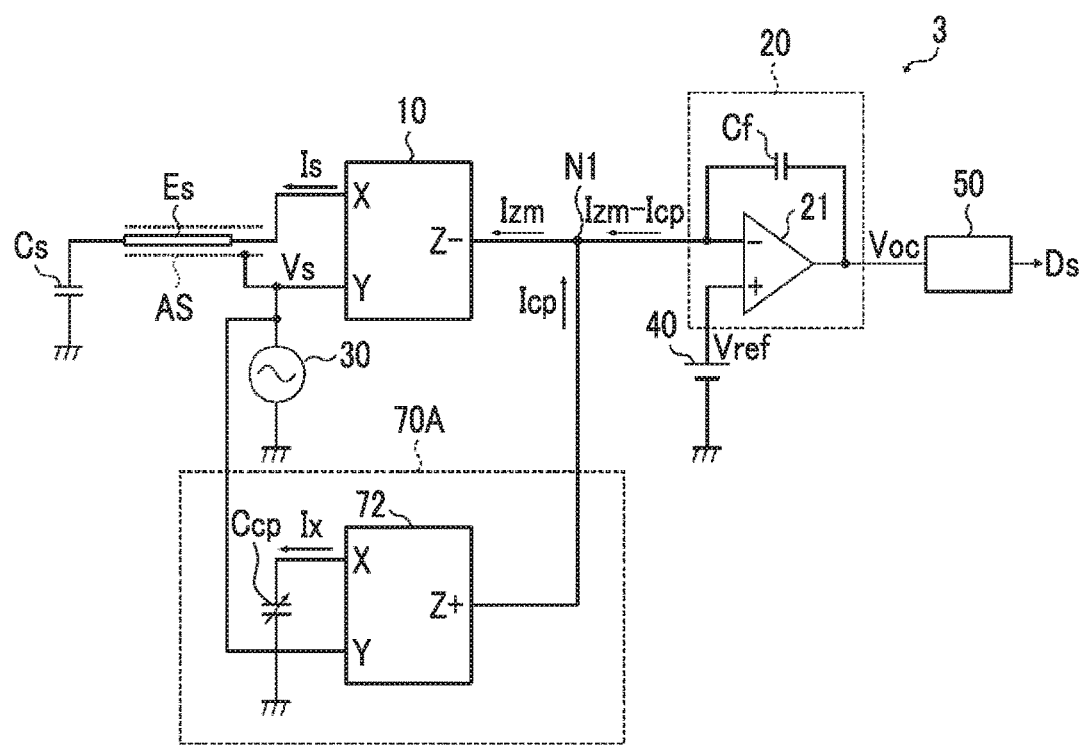
FIG. 13 is a diagram showing a configuration example in a case where a detection voltage and a correction voltage are made common in an electrostatic capacitance detection unit shown in FIG. 11.
Figure 14A:
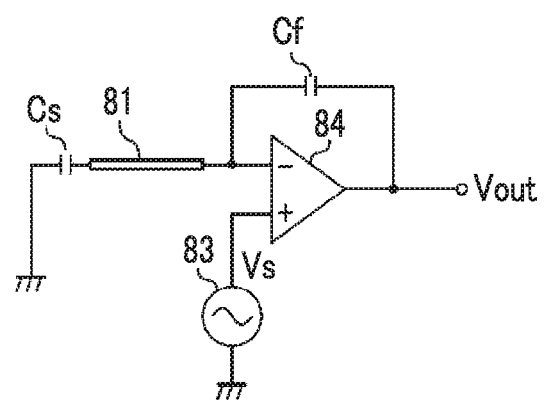
FIGS. 14A and 14B are diagrams showing the configuration of a general self-capacitance type sensor.
Figure 14B:
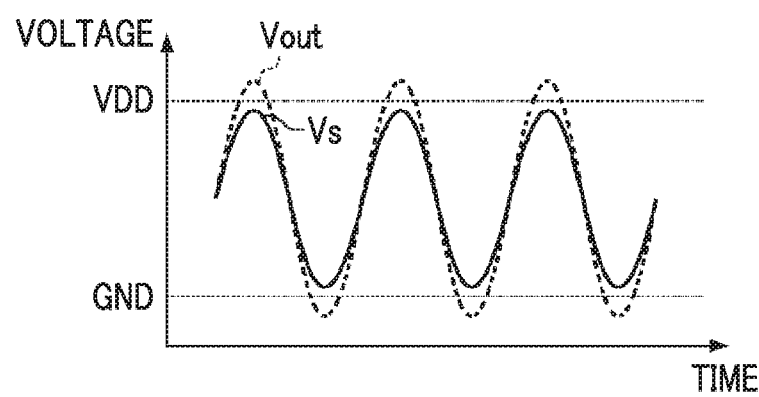
Figure 15:
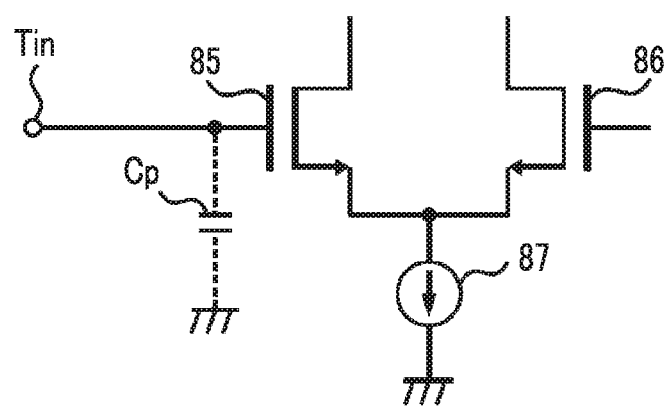
FIG. 15 is a diagram illustrating parasitic capacitance in an input terminal of an operational amplifier.

In the example of FIG. 11, although the detection voltage Vs and the correction voltage Vcp are respectively generated by different voltage generation circuits, if adjustment of the electrostatic capacitance value of the correction capacitor Ccp is possible, as shown in FIG. 13, the detection voltage Vs and the correction voltage Vcp may be generated by the common voltage generation circuit 30. With this, it is possible to simplify a circuit configuration.

Other Modification Examples

In the examples of FIGS. 11 to 13, although the correction current output circuit 72 (for example, the circuit having the configuration shown in FIG. 5 or 6) which outputs the correction current Icp in the same direction as the current Ix output to the correction capacitor Ccp is used, the correction current output circuit 72 (for example, the circuit having the configuration shown in FIG. 3) which outputs the correction current Icp in a reverse direction to the current Ix may be used. In this case, the correction voltage Vcp which includes the AC component having a phase reverse to the detection voltage Vs should be generated in the voltage generation circuit 71.

In the examples of FIGS. 11 and 13, although the current output circuit 10 which outputs the detection current Izm in a reverse direction to the drive current Is is used, for example, even in a case where the current output circuit 10 having the circuit configuration shown in FIG. 5 or 6 is used, correction of the detection current Izp is possible. In this case, since the detection current Izp flows in the same direction as the drive current Is, the correction current Icp having a phase reverse to the examples of FIGS. 11 and 13 should be output from the detection current correction circuit 70. For example, the correction voltage Vcp which includes an AC component having a phase reverse to the detection voltage Vs may be generated in the voltage generation circuit 71. Alternatively, the correction current output circuit 72 may be changed to, for example, the circuit having the configuration shown in FIG. 3 such that the correction current Icp in a reverse direction to the current Ix output to the correction capacitor Ccp is output.

Although several embodiments of the invention have been described above, the invention is not limited to these embodiments, and further includes various variations. For example, in the electrostatic capacitance detection unit 3 shown in FIGS. 7 and 10, although the correction current Icp of the detection current correction circuit 70 is supplied onto the current path (N1) between the current output circuit 10 and the current-voltage conversion circuit 20, in other embodiments of the invention, the correction current Icp of the detection current correction circuit 70 may be supplied onto the current path (N2) between the current output circuit 10 and the detection electrode Es.

The input device of the invention is not limited to a user interface device which inputs information according to an operation of a finger or the like. That is, the input device of the invention can be widely applied to a device which inputs information according to electrostatic capacitance of a detection electrode changing according to proximity of various objects without being limited to a human body.

It should be understood by those skilled in the art that various modifications, combinations, sub-combinations and alterations may occur depending on design requirements and other factors insofar as they are within the scope of the appended claims of the equivalents thereof.

What is claimed is:

1. An input device for inputting information according to proximity of an object, the input device comprising:
    a detection electrode configured to form a detection-target capacitor between the detection electrode and the object such that an electrostatic capacitance of the detection-target capacitor changes according to the proximity of the object to the detection electrode;
    a current output circuit configured to output a drive current and a detection current proportional to the drive current, the drive current flowing to the detection electrode such that a detection voltage generated in the detection electrode approximates a predetermined voltage having a periodically changing level, whereby a value of the drive current corresponds to the electrostatic capacitance of the detection-target capacitor;

a current-voltage conversion circuit which outputs a voltage according to the detection current; and a detection current correction circuit having a node connected to a current path through which the detection current flows from the current output circuit to the current-voltage conversion circuit, or a current path through which the drive current flows from the current output circuit to the detection electrode, and outputs from the node a correction current for decreasing an amplitude of the detection current.

2. The input device according to claim 1, wherein the current output circuit includes:

an amplification circuit which amplifies a difference between the predetermined voltage input thereto and the detection voltage generated in the detection electrode, and outputs the drive current corresponding to the amplified difference to the detection electrode; and a current mirror circuit which outputs the detection current proportional to the drive current.

3. The input device according to claim 1, wherein the current output circuit includes:

a first amplification circuit which amplifies a difference between the predetermined voltage input thereto and the detection voltage generated in the detection electrode, and outputs the drive current corresponding to the amplified difference to the detection electrode; and a second amplification circuit which amplifies the difference between the predetermined voltage and the detection voltage generated in the detection electrode, and outputs the detection current corresponding to the amplified difference.

4. The input device according to claim 1, wherein the current-voltage conversion circuit includes:

a capacitor having a first terminal to which the detection current is input; and a third amplification circuit which amplifies a difference between a voltage at the first terminal of the capacitor and a reference voltage, and outputs a voltage corresponding to the amplified difference to a second terminal of the capacitor.

5. The input device according to claim 1, wherein the detection current correction circuit includes:

a correction capacitor having a first terminal connected to the node and a second terminal to which a correction voltage having a periodically changing level is applied.

6. The input device according to claim 5, wherein the correction voltage is equal to the detection voltage.

7. The input device according to claim 6, further comprising:

a shield electrode which is provided in proximity to the detection electrode and to which the detection voltage is applied.

8. The input device according to claim 1, wherein the detection current correction circuit includes:

a correction capacitor, and a correction current output circuit which outputs a current to the correction capacitor such that a correction voltage generated in the correction capacitor approximates a predetermined voltage having a periodically changing level, and outputs from the node the correction current proportional to the current output to the correction capacitor.

9. The input device according to claim 8, wherein the correction current output circuit includes:

an amplification circuit which amplifies a difference between the predetermined voltage input thereto and the correction voltage generated in the correction capacitor, and outputs a correction reference current corresponding to the amplified difference to the correction capacitor; and a current mirror circuit which outputs the correction current proportional to the correction reference current.

* * * * *